(12) United States Patent
Beyly et al.

(10) Patent No.: US 9,118,330 B2
(45) Date of Patent: Aug. 25, 2015

(54) DIRECTIONAL CAPACITIVE PROXIMITY SENSOR

(75) Inventors: Laurent Beyly, Peynier (FR); Cyril Troise, Marseilles (FR); Maxime Teissier, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 591 days.

(21) Appl. No.: 13/309,411

(22) Filed: Dec. 1, 2011

(65) Prior Publication Data

US 2012/0139562 A1    Jun. 7, 2012

(30) Foreign Application Priority Data

Dec. 1, 2010   (FR) ..................................... 10 04669

(51) Int. Cl.
| | |
|---|---|
| *G06F 3/044* | (2006.01) |
| *H03K 17/96* | (2006.01) |
| *G01R 27/26* | (2006.01) |
| *H03K 17/955* | (2006.01) |
| *G06F 3/041* | (2006.01) |

(52) U.S. Cl.
CPC ........ *H03K 17/9622* (2013.01); *G01R 27/2605* (2013.01); *G06F 3/044* (2013.01); *G06F 3/0416* (2013.01); *H03K 17/955* (2013.01); *H03K 2217/960725* (2013.01); *H03K 2217/960765* (2013.01)

(58) Field of Classification Search
CPC ....... H03K 2217/960765; H03K 2217/960725
USPC ........................................................ 324/679
See application file for complete search history.

(56) References Cited

U.S. PATENT DOCUMENTS

| | | | | |
|---|---|---|---|---|
| 5,457,289 | A  * | 10/1995 | Huang et al. ............... | 178/18.08 |
| 6,452,514 | B1 | 9/2002 | Philipp ........................... | 341/33 |
| 6,466,036 | B1 | 10/2002 | Philipp ........................ | 324/678 |
| 6,549,193 | B1 * | 4/2003 | Huang et al. .................. | 345/173 |
| 7,339,579 | B2 * | 3/2008 | Richter et al. ................ | 345/173 |
| 2005/0162408 | A1 * | 7/2005 | Martchovsky ................ | 345/173 |
| 2005/0184965 | A1 * | 8/2005 | Geaghan et al. .............. | 345/173 |

(Continued)

FOREIGN PATENT DOCUMENTS

| | | |
|---|---|---|
| EP | 0680006 A1 | 11/1995 |
| EP | 1593988 A1 | 11/2005 |
| EP | 1848111 A2 | 10/2007 |

OTHER PUBLICATIONS

U.S. Appl. No. 13/309,284, filed Dec. 1, 2011, Capacitive Touch Pad Configured for Proximity Detection.

(Continued)

*Primary Examiner* — Jeff Natalini
(74) *Attorney, Agent, or Firm* — Seed IP Law Group PLLC

(57) ABSTRACT

The present disclosure relates to a method for detecting an object near an electronic system, comprising steps of: forming electrodes around a central area, on an electrically insulating medium, determining measurements representative of the capacitance of the electrodes, and comparing the measurements with a detection threshold, and deducing whether or not an object is near the central area in a detection, the electrically insulating medium on which the electrodes are formed being deposited on an electrically conductive medium forming a shield, the capacitance measurements being taken by simultaneously activating all the electrodes.

30 Claims, 5 Drawing Sheets

(56) References Cited

U.S. PATENT DOCUMENTS

| | | | |
|---|---|---|---|
| 2006/0250142 A1 | 11/2006 | Abe | 324/663 |
| 2006/0267580 A1* | 11/2006 | Fukushima et al. | 324/207.13 |
| 2007/0062739 A1 | 3/2007 | Philipp et al. | |
| 2007/0262963 A1 | 11/2007 | Xiao-Ping et al. | |
| 2007/0268243 A1* | 11/2007 | Choo et al. | 345/104 |
| 2008/0142281 A1 | 6/2008 | Geaghan | |
| 2008/0246723 A1 | 10/2008 | Baumbach | 345/156 |
| 2010/0042346 A1 | 2/2010 | Kuang | 702/65 |
| 2010/0164759 A1 | 7/2010 | Kivela et al. | |
| 2010/0181180 A1 | 7/2010 | Peter | 200/5 R |
| 2010/0219846 A1 | 9/2010 | Dubery | |
| 2010/0289759 A1 | 11/2010 | Fisher et al. | |
| 2010/0295559 A1 | 11/2010 | Osoinach | 324/658 |
| 2010/0302202 A1 | 12/2010 | Takeuchi et al. | |
| 2011/0018560 A1* | 1/2011 | Kurashima | 324/679 |
| 2011/0074446 A1 | 3/2011 | Chou et al. | |
| 2011/0120784 A1 | 5/2011 | Osoinach et al. | |
| 2011/0234528 A1 | 9/2011 | Guedon et al. | |
| 2012/0050211 A1 | 3/2012 | King et al. | |
| 2012/0113051 A1 | 5/2012 | Bird et al. | |

OTHER PUBLICATIONS

U.S. Appl. No. 13/309,413, filed Dec. 1, 2011, Method for Controlling a Capacitive Touch Pad.

U.S. Appl. No. 14/205,157, filed Mar. 11, 2014, Capacitive Touch Pad Configured for Proximity Detection.

* cited by examiner

DIRECTIONAL CAPACITIVE PROXIMITY SENSOR

BACKGROUND

1. Technical Field

The present disclosure relates to a capacitive sensor-type device for detecting the proximity of an object. The present disclosure particularly applies to screens, control keyboards, and more generally to any device wherein it is desirable to detect an object such as a user's finger or hand near the device.

2. Description of the Related Art

One well-known method involves using electrodes in the form of keys or in the form of bands disposed, according to a matrix configuration forming a touch pad, for detecting the presence of a user's finger on a key or on an area of the touch pad. Such a touch pad may be associated with a screen in devices such as mobile telephones, to detect the position of a finger on an area of the screen, i.e., at a distance of less than a few millimeters from the latter.

FIG. 1 represents a touch pad TS comprising electrodes T1, . . . Tp, R1, . . . Rn having the form of bands, which include electrodes Ti (i being a whole number ranging between 1 and p) disposed in columns, and electrodes Rj (j being a whole number ranging between 1 and p) disposed in rows transversal to the electrodes Ti. Generally, only one of the so-called "sending" electrodes is activated at a given instant, and so-called "receiving" electrodes are scanned one after the other or simultaneously to obtain measurements representative of the capacitance of each pair of electrodes comprising the active sending electrode and the scanned receiving electrode. The column electrodes Ti (or row electrodes Rj) are connected as sending electrodes, and the row electrodes Rj (or column electrodes Ti) are connected as receiving electrodes. Using the measurements obtained, the position of an object on the touch pad may be determined, given that the presence of an object on the touch pad can change the capacitance of pairs of electrodes located near the object.

Amongst the capacitance measurement methods suited to touch pads, there are particularly methods based on the measurement of a capacitor charge or discharge time into a resistor, methods based on the use of a relaxation oscillator, and methods based on the charge transfer principle. The methods using a relaxation oscillator involve generating a signal having a frequency which varies according to the capacitance to be measured, then measuring the frequency of that signal. The methods based on charge transfer involve using a "sampling" capacitor, with a high capacitance compared to the capacitances to be measured, charging the capacitance to be measured, and transferring the charge of the capacitance to be measured into the sampling capacitor, and repeating these charge and transfer operations a certain number of cycles. Certain methods based on charge transfer involve executing a fixed number of charge and transfer cycles, and measuring the voltage at the terminals of the sampling capacitor, which is representative of the capacitance to be measured, at the end of the fixed number of cycles. Other methods based on charge transfer execute charge and transfer cycles until the voltage at the terminals of the sampling capacitor reaches a threshold voltage, the number of cycles thus executed being representative of the capacitance to be measured.

An example of implementation of the method based on charge transfer applied to a touch pad is described in U.S. Pat. No. 6,452,514. FIG. 1 represents a control circuit IOC of the touch pad TS, as described in that document. The circuit IOC comprises input/output ports P0, P1, . . . Pn and output ports Pn+1 to Pn+p. Each input/output port Pj (j being a whole number ranging between 1 and n) is connected to a respective input/output stage of the circuit IOC. Each input/output stage connected to a port Pj comprises a switch I4 controlled by a signal S4, and a transistor M5 the gate of which is controlled by a signal S5. Each switch I4 comprises a terminal connected to a node common to other input/output stages and a terminal connected to the port Pj and to the drain of the transistor M5. The source of each transistor M5 is connected to the ground. Each output port Pn+i (i being a whole number ranging between 1 and p) is linked to a supply voltage source Vdd of the circuit through a transistor M6 the gate of which is controlled by a signal S6. The port P0 is connected to the drain of a transistor M5 the gate of which is controlled by a signal S5 and the source of which is grounded. The port P0 is also connected to a logic circuit LGC supplying the control signals S4, S5, S6 of each input/output and output stage.

To control the electrodes T1-Tp and R1-Rn, the port P0 is connected to a terminal of a sampling capacitor Cs the other terminal of which is connected to the ground. The ports P1 to Pn are connected to the row electrodes R1-Rn, and the ports Pn+1 to Pn+p are connected to the column electrodes T1 to Tp.

Each row electrode Rj forms with each of the column electrodes Ti a capacitor the capacitance of which varies particularly according to the proximity of an object to an area in which the row electrode overlaps with the column electrode. The circuit LGC receives numbers (i, j) of a pair of ports to be analyzed Pn+i, Pj to locate an object on the touch pad TS, and supplies a measurement DT representative of the capacitance of the pair of electrodes Ti, Rj connected to the selected pair of ports Pn+i, Pj. The measurement representative of the capacitance of the pair of electrodes is obtained according to a number of cycles executed for charging the pair of electrodes and transferring the charge to the sampling capacitor Cs, and to the voltage at the terminals of the capacitor Cs after the number of cycles executed.

The logic circuit LGC manages the control circuit IOC that has just been described in accordance with a sequence of steps summarized in Table 1 below:

TABLE 1

| | Port | | | | |
|---|---|---|---|---|---|
| | P0 | Pj | | Pn + i | |
| Step | S5 | S4 | S5 | S6 | Description |
| 1 | 1 | 0 | 1 | 0 | Discharge of Cs and Rj |
| 2 | 0 | 0 | 1 | 0 | Dead time |
| 3 | 0 | 1 | 0 | 1 | Connection of Cs to Rj and Ti to Vdd |
| 4 | 0 | 0 | 1 | 0 | Dead time |
| 5 | 0 | 0 | 1 | 0 | Rj on 0 |
| 6 | 0 | 0 | 1 | 0 | Dead time |
| 7 | 0 | 0 | 1 | 0 | Reading of the charge of Cs |

In Table 1 and below, i and j represent whole numbers varying from 1 to p, and from 1 to n, respectively.

The sequence of steps which comprises steps 1 to 7, is executed successively for each port Pj and each port Pn+i, and thus for each pair of electrodes (Ti, Rj) connected to the circuit IOC. During the execution of this sequence, all the switches I4 and transistors M5, M6 of the circuit IOC, the control signals S4, S5, S6 of which are not mentioned in Table 1, remain open or off. Step 1 is an initialization step during which the signals S5 switch on the transistors M5, connected to the ports P0 and Pj, to discharge the capacitor Cs and the selected electrode Rj. The next step 2 is a dead-time step during which all the transistors M5, M6 are off and all the switches I4 are open. In step 3, the switch I4 connected to the port Pi is closed to enable a charge transfer between the electrode Rj and the capacitor Cs. In parallel, the transistor M6 connected to the port Pn+i is switched on to charge the electrode Ti to the supply voltage Vdd. The result is a charge transfer between the electrode Rj and the capacitor Cs. The next step 4 is a dead-time step, identical to step 2. In the next step 5, the transistor M5 connected to the port Pj is switched on to discharge the electrode Rj. The next step 6 is a dead-time step, identical to step 2. In the next step 7, all the switches I1 remain open and only the transistor M5 connected to the port Pj is switched on. The voltage of the port P0, corresponding to the voltage of the capacitor Cs, is then measured.

The execution of steps 3 to 6 is repeated a certain fixed number of cycles. After executing this number of cycles, the voltage of the port P0 is measured. The presence and the position of an object on the touch pad TS are then determined according to the measurements obtained for each pair of electrodes Ti, Rj. In practice, a finger of a user can only be detected and located on the touch pad TS if it is less than a few millimeters from an overlapping area of the electrodes of a pair of electrodes (Ti, Rj).

BRIEF SUMMARY

It may be useful to integrate a proximity sensor into a system such as a mobile telephone, whether or not integrating the touch pad described above, to activate or deactivate the system or more generally, to activate or deactivate certain functions of the system. Therefore, the proximity sensor may be used to detect when the user moves his hand or a finger to within a distance of a few centimeters from the system or more. For example, control keyboard backlighting may be activated when the user moves his hand toward the keyboard. A proximity detector may also be integrated into a mobile telephone to lock a touch-sensitive keyboard and/or put a screen into low-energy mode during a telephone call, when the user moves the telephone close to his ear.

Some embodiments relate to a method for detecting an object near an electronic system, comprising steps of: forming electrodes around a central area, on an electrically insulating medium, determining measurements representative of the capacitance of the electrodes, and comparing the measurements with a detection threshold, and deducing whether or not an object is near the central area in a detection field. According to one embodiment, the electrically insulating medium on which the electrodes are formed is deposited on an electrically conductive medium forming a shield, the capacitance measurements being taken by simultaneously activating all the electrodes.

According to one embodiment, the detection threshold is defined so as to detect an object at a distance of at least several centimeters along an axis perpendicular to the central area and passing through a point of the central area, located at an equal distance from opposite pairs of electrodes of the electrodes.

According to one embodiment, the method comprises a step of forming an electrically conductive edge around the set comprising the electrodes and the central area.

According to one embodiment, the method comprises a step of forming an electrically insulating layer covering the electrodes.

According to one embodiment, the method comprises a step of generating a voltage greater than a supply voltage of the electronic system, and of using the voltage generated to determine a measurement representative of the capacitance of the electrodes.

According to one embodiment, the method comprises a step of connecting the shield to the ground.

According to one embodiment, each measurement representative of capacitance comprises steps of: executing several cycles of charging the electrodes and of transferring the charge between the electrodes and a sampling capacitor, and determining the measurement representative of the capacitance of the electrodes according to the number of charge and transfer cycles, so that the voltage at the terminals of the sampling capacitor reaches a threshold voltage, or according to the voltage at the terminals of the sampling capacitor, after a fixed number of charge and transfer cycles.

According to one embodiment, each measurement representative of the capacitance of the electrodes comprises steps of: (a) applying a first voltage to a first terminal of a sampling capacitor and a second intermediate voltage in between the first voltage and a third voltage greater than or equal to a ground voltage, to the second terminal of the sampling capacitor, (b) applying the third voltage to a first group of the electrodes, and the second voltage to a second group of the electrodes, not comprising the electrodes of the first group, (c) linking the electrodes of the first group to the first terminal of the sampling capacitor and applying the second voltage to the electrodes of the second group and to the second terminal of the sampling capacitor, to transfer electric charges between the electrodes and the sampling capacitor, and (d) executing several cycles each comprising steps (b) and (c), the measurement representative of the capacitance of the electrodes being determined according to the voltage at a terminal of the sampling capacitor the other terminal of which receives the third voltage, after executing a fixed number of cycles, or according to the number of cycles executed so that the voltage at a terminal of the sampling capacitor reaches a threshold voltage.

Some embodiments relate to a device for detecting an object near an electronic system, comprising electrodes surrounding a central area, on an electrically insulating medium, and a control circuit for controlling the electrodes, configured for determining a measurement representative of the presence of an object near the central area.

According to one embodiment, the device comprises an electrically conductive shield, on which the electrically insulating medium is deposited, the control circuit being configured for implementing the method defined above.

According to one embodiment, the shield comprises an electrically conductive edge formed around the set comprising the electrodes and the central area.

According to one embodiment, the device comprises an electrically insulating layer covering the electrodes.

According to one embodiment, the device comprises two electrodes disposed in rows and two electrodes disposed in columns, transversal to the row electrodes.

According to one embodiment, the shield is connected to the ground.

Some embodiments also relate to an electronic system comprising a proximity detection device.

Some embodiments also relate to a portable object comprising a proximity detection device like the one defined above.

BRIEF DESCRIPTION OF THE SEVERAL VIEWS OF THE DRAWINGS

Some examples of embodiments of the present disclosure will be described below in relation with, but not limited to, the following figures, in which.

DETAILED DESCRIPTION

Figure 1:
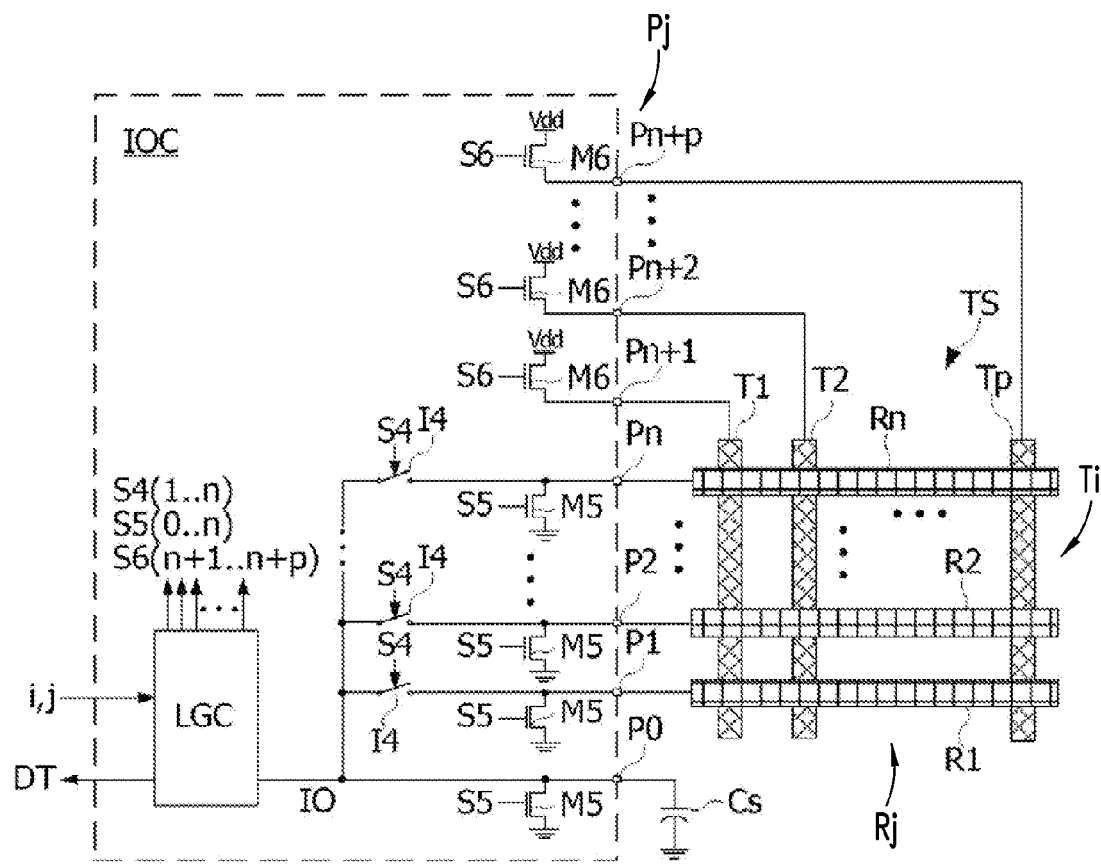
FIG. 1 described above schematically represents a touch pad and a control circuit of the touch pad, according to prior art.
Figure 2:
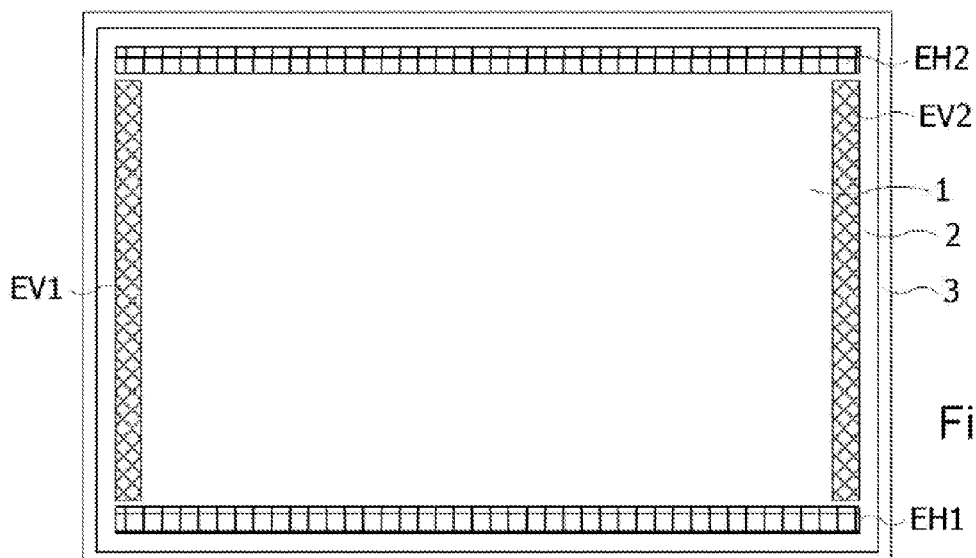
FIG. 2 represents a front view of a proximity detection device according to one embodiment.
Figure 3:
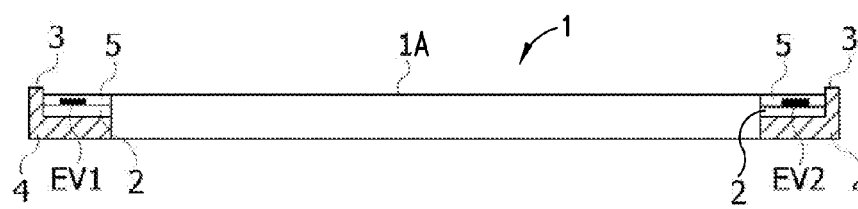
FIG. 3 represents a cross section of the proximity detection device in FIG. 2.

FIGS. 2 and 3 represent a proximity detection device according to one embodiment. The proximity detection device comprises four electrodes in the form of bands disposed in a same plane, two electrodes EV1, EV2 of which are disposed in columns and two electrodes EH1, EH2 of which are disposed in rows transversal to the column electrodes. In the example in FIG. 2, the electrodes EV1, EV2, EH1, EH2 are rectilinear and disposed so as to surround a central area 1 rectangular in shape. Positioned in the central area 1 is a central structure 1A that in one embodiment is simply a support structure of dielectric material, for example. Alternatively, the central structure 1A could include control electronics, such as the controller IOC1 of FIG. 5, or a detection device, such as the touch pad TS shown in FIG. 1.

According to one embodiment, the electrodes EV1, EV2, EH1, EH2 are formed on an electrically insulating layer 2, and the layer 2 is deposited on an electrically conductive layer 4 forming a shield. It shall be noted that, in one embodiment, the layers 2 and 4 are formed solely in an area extending beneath the electrodes, excluding an area located in the center of the central area 1. On the periphery of the layer 4 there is an edge 3 extending along the electrodes EV1, EV2, EH1, EH2 and surrounding the layer 2, the electrodes and the central area 1. The electrodes may also be covered by an electrically insulating layer 5. The layer 4 is grounded. It shall be noted that the layers 2, 4 and 5 can be formed on the entire surface area extending beneath the central area 1 and the electrodes or solely in an area extending beneath the electrodes EV1, EV2, EH1, EH2, excluding an area located in the center of the central area 1.

Figure 4:
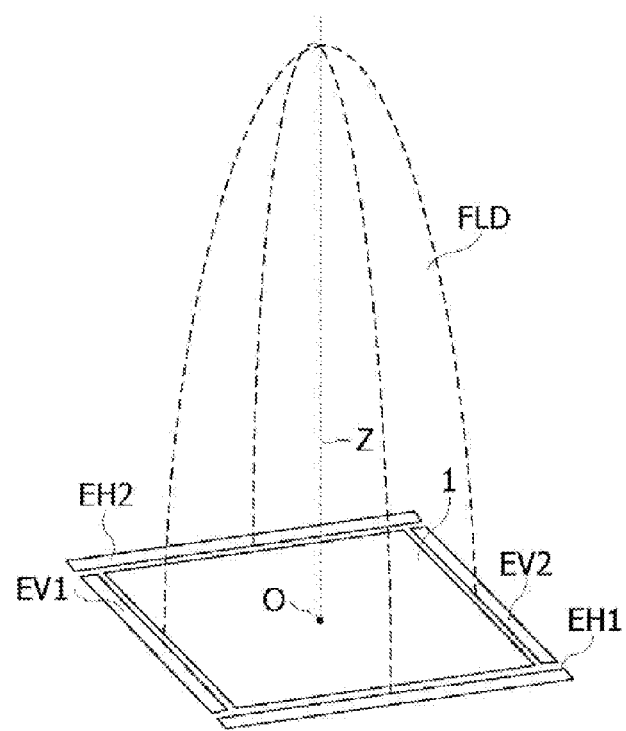
FIG. 4 represents the proximity detection device in perspective and a detection field of the detection device, FIG. 5 schematically represents a control circuit of the proximity detection device, according to one embodiment, FIG. 6 schematically represents a control circuit of the proximity detection device, according to another embodiment.

As shown in FIG. 4, the detection field FLD of the proximity detection device is delimited by a lobe extending along an axis Z perpendicular to the plane of the electrodes EV1, EV2, EH1, EH2, and passing through a point O of this plane located at an equal distance from the row electrodes EH1, EH2 and at an equal distance from the column electrodes EV1, EV2. Thanks to the presence of the shield layer 4, the detection field may extend several tens of centimeters from the electrodes. Due to the presence of the edge 3, the detection field FLD barely extends outside the volume delimited by the plane of the electrodes and the planes perpendicular to this plane and passing through each of the electrodes. The detection field FLD therefore has a section in a plane passing through the axis OZ which is substantially parabolic in shape.

Therefore, these arrangements enable both good detection directivity and a relatively high detection distance to be obtained.

The column EV1, EV2 (or row EH1, EH2) electrodes may be used as sending electrodes, and the row EH1, EH2 (or column EV1, EV2) electrodes may be used as receiving electrodes. According to one embodiment, the two sending electrodes are activated simultaneously and the two receiving electrodes are scanned simultaneously, to detect an object near the electrodes in the detection field FLD.

Figure 5:
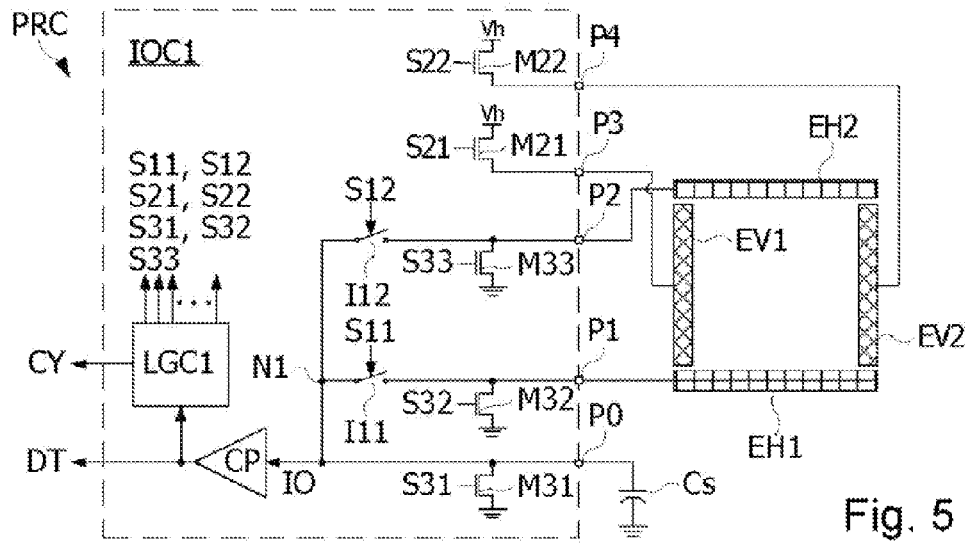

FIG. 5 represents a control circuit IOC1 of the proximity detection device, according to one embodiment. The circuit IOC1 is for example integrated into a processor PRC. The processor PRC is for example of microcontroller type. The circuit IOC1 comprises input/output ports P0, P1, P2 and output ports P3 and P4. Each input/output port P0, P1, P2 is connected to a respective input/output stage of the circuit IOC1 comprising a transistor the gate of which is controlled by a signal S31, S32, S33. The source of each transistor M31, M32, M33 is connected to the ground and the drain of these transistors is connected to one of the ports P0, P1, P2. The ports P1, P2 are linked through a switch I11, I12, to a common node N1 connected to the port P0. The switches I11, I12 are controlled by two signals S11, S12. Each output port P3, P4 is linked to a voltage source Vh through a transistor M21, M22 the gate of which is controlled by a signal S21, S22. The port P0 is also connected to a comparator CP the output of which is connected to a logic circuit LGC1 supplying the control signals S11, S12, S21, S22, S31, S32, S33 of the switches I11, I12 and the transistors M21, M22, M31, M32, M33.

To control the electrodes EV1, EV2, EH1, EH2, the port P0 is connected to a terminal of a sampling capacitor Cs the other terminal of which is connected to the ground. The ports P1 and P2 are connected to the row electrodes EH1, EH2, and the ports P3 and P4 are connected to the column electrodes EV1, EV2. The comparator CP supplies the circuit LGC1 with a detection signal DT. The circuit LGC1 supplies a measurement CY representative of the capacitance formed between the electrodes EH1, EH2, EV1, EV2. The measurement representative of the capacitance of the electrodes is obtained according to a number of executed cycles of charging and transferring the charge to the sampling capacitor Cs, and to the voltage at the terminals of the capacitor Cs after the number of cycles executed.

The logic circuit LGC1 can manage the control circuit IOC1 that has just been described in accordance with a sequence of steps summarized in Table 2 below:

TABLE 2

| Step | S31 | S11, S12 | S32, S33 | S21, S22 | Description |
| --- | --- | --- | --- | --- | --- |
| 1 | 1 | 0 | 1 | 0 | Discharge of Cs, EH1, and EH2 |
| 2 | 0 | 0 | 0 | 0 | Dead time |
| 3 | 0 | 1 | 0 | 1 | Connection of EH1, EH2 to Cs, and EV1, EV2 to Vh |
| 4 | 0 | 0 | 0 | 0 | Dead time |
| 5 | 0 | 0 | 1 | 0 | EH1 and EH2 to 0 |
| 6 | 0 | 0 | 0 | 0 | Dead time |
| 7 | 0 | 0 | 1 | 0 | Reading of the charge of Cs |

The sequence of steps comprises steps 1 to 7 executed periodically. Step 1 is an initialization step during which the signals S31, S32, S33 switch on the transistors M31, M32 and M33 connected to the ports P0, P1 and P2, to discharge the capacitor Cs and the electrodes EH1 and EH2. The next step 2 is a dead-time step during which all the transistors M21, M22, M31, M32, M33 are off and the switches I11, I12 are open. In step 3, the switches I11, I12 connected to the ports P1, P2 are closed to enable a charge transfer between the electrodes EH1, EH2 and the capacitor Cs. In parallel, the transistors M21, M22 connected to the ports P3, P4 are switched on to charge the electrodes EV1, EV2 to the voltage Vh. The result is a charge transfer between the electrodes EH1, EH2 and the capacitor Cs. The next step 4 is a dead-time step, identical to step 2. In the next step 5, the transistors M32, M33 connected to the ports P1, P2 are switched on to discharge the electrodes EH1, EH2. The next step 6 is a dead-time step, identical to step 2. In the next step 7, the switches I11, I12 remain open and only the transistors M32, M33 connected to the ports P1, P2 are switched on. The voltage of the port P0, corresponding to the voltage of the capacitor Cs, is then measured.

According to one embodiment, the execution of steps 3 to 6 is repeated a certain fixed number of cycles. After executing this fixed number of cycles, the voltage of the port P0 is measured in step 7. The presence and the position of an object in the detection field FLD is then determined according to the measurement of the measured voltage of the capacitor Cs. In another embodiment, the execution of steps 2 to 7 is repeated a variable number of cycles CY until the voltage of the capacitor Cs reaches a threshold voltage set by the comparator CP.

Figure 6:
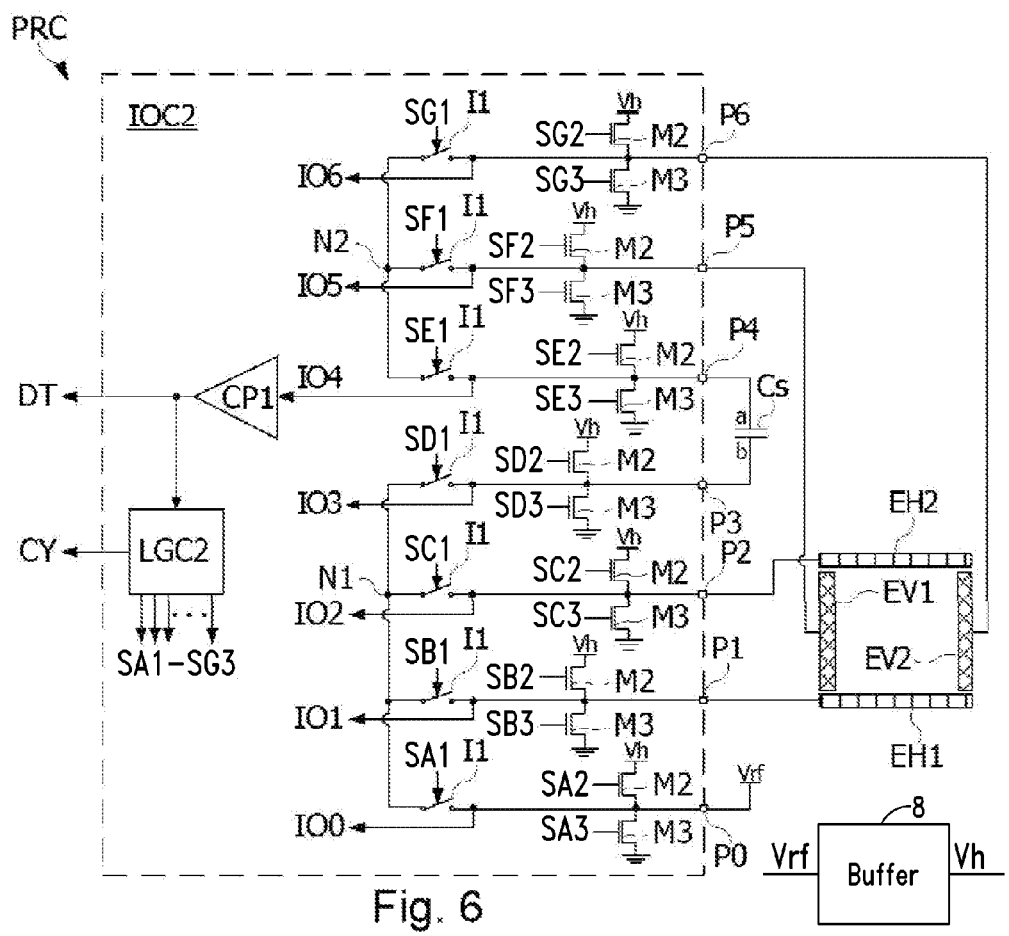

FIG. 6 represents a control circuit IOC2 of the proximity detection device, according to another embodiment. The circuit IOC2 comprises seven input/output ports P0, P1, . . . P6. Each port P0-P7 is connected to a respective input/output stage of the circuit IOC2. Each input/output stage comprises a switch I1 controlled by a corresponding signal of signals SA1-SG1, a first transistor M2 having a gate controlled by a corresponding signal of signals SA2-SG2, and a second transistor M3 having a gate controlled by a corresponding signal of signals SA3-SG3. The switch I1 comprises a terminal connected to a node common to other input/output stages and a terminal connected to the port P0-P7 of the stage, to the source of the transistor M2 and to the drain of the transistor M3, of the stage. The drain of the transistor M2 receives a voltage Vh which may be the supply voltage of the circuit, and the source of the transistor M3 is connected to the ground. The circuit IOC2 comprises two groups of input/output stages each comprising a common node N1, N2. The switches I1 of the ports P0 to P3 are connected to a first common node N1, and the switches I1 of the ports P4 to P7 are connected to a second common node N2, not connected to the common node N1. In addition, at least one of the ports, for example the port P4, is connected to an output 104 connected to the input of a comparator CP1. The output of the comparator CP1 is connected to a logic circuit LGC2 supplying the control signals SA1-SG3. Each of the other ports P0 to P7 may also be connected to an output 100 to 107 connected to a comparator (not represented) which may be identical to the comparator CP1, and the output of which is connected to the circuit LGC2.

According to one embodiment, to control electrodes EH1, EH2, EV1, EV2 of the proximity detection device, one of the ports connected to a comparator, for example the port P4 connected to the comparator CP1, is connected to a terminal a of a sampling capacitor Cs the other terminal b of which is connected to a port of the other group of input/output stages, for example the port P3. Therefore, whatever the status of the switches I1, the terminals of the capacitor Cs cannot be short-circuited. Furthermore, the port P0 for example, receives a reference voltage Vrf lower than the voltage Vh, for example the voltage Vh divided by 2, and the other ports P1, P2, P5, P6 are each connected to one of the electrodes EH1, EH2, EV1, EV2. In the example in FIG. 6, the ports P1 and P2 are connected respectively to the row electrodes EH1, EH2, and the ports P5 and P6 are connected respectively to the column electrodes EV1, EV2.

Together with the column electrodes EV1, EV2, the row electrodes EH1, EH2 form capacitors the capacitance of which varies particularly according to the proximity of an object. The comparator CP1 supplies the circuit LGC2 with a detection signal DT. The circuit LGC2 supplies a number of cycles CY that were used to discharge the capacitor Cs below a certain threshold detected by the comparator CP1. This threshold is for example in the order of Vh/3.

The logic circuit LGC2 manages the control circuit IOC2 that has just been described in accordance with a sequence of steps summarized in Table 3 below:

TABLE 3

| Step | SA1 | SB1, SC1 | SD1 | SD3 | SE1 | SE2 | SF1, SG1 | SF3, SG3 | Description |
|---|---|---|---|---|---|---|---|---|---|
| 1 | 1 | 0 | 1 | 0 | 1 | 0 | 0 | 0 | Charge of Cs between Vh and Vrf |
| 2 | 0 | 0 | 0 | 0 | 0 | 0 | 0 | 0 | Dead time |
| 3 | 1 | 1 | 0 | 0 | 0 | 0 | 0 | 1 | Charge of EH1, EH2/EV1, EV2 between 0 and Vrf |
| 4 | 0 | 0 | 0 | 0 | 0 | 0 | 0 | 0 | Dead time |
| 5 | 1 | 1 | 1 | 0 | 1 | 0 | 1 | 0 | Charge transfer between EH1, EH2/EV1, EV2 and Cs |
| 6 | 0 | 0 | 0 | 0 | 0 | 0 | 0 | 0 | Dead time |
| 7 | 0 | 0 | 0 | 0 | 0 | 1 | 0 | 0 | Reading of the charge of Cs |

The sequence of steps comprises steps 1 to 7. During the execution of this sequence, all the switches I1 and the transistors M2, M3 of the circuit IOC2, having control signals that are not mentioned in Table 3, remain open or off. In step 1, the switch I1 of the stage connected to the port P3 is closed, while the signal SE2 switches on the transistor M2 connected to the port P4, and the signal SA1 closes the switch I1 connected to the port P0. Therefore, the terminals a and b of the capacitor Cs respectively receive the voltages Vh and Vrf, to charge the capacitor Cs to a voltage equal to the difference between the voltages Vh and Vrf. The next step 2 is a dead-time step during which all the transistors M2, M3 are off and the switches I1 are open. In step 3, the electrodes EH1, EH2, EV1, EV2 are charged between Vrf and the ground. For this purpose, the transistors M3 connected to the ports P5, P6 are switched on using the corresponding signals SF3, SG3 to put the electrodes EV1, EV2 to the ground. In parallel, the switches I1 connected to the ports P0, P1, P2 are open to put the electrodes EH1, EH2 to the voltage Vrf. The next step 4 is a dead-time step, identical to step 2. In the next step 5, all the switches I1 are closed simultaneously to transfer electric charges between the terminals a, b of the capacitor Cs and the electrodes EH1, EH2, EV1, EV2. Therefore, the terminal a of the capacitor Cs is linked to the electrodes EV1, EV2, and the terminal b of the capacitor Cs is linked to the electrodes EH1, EH2. Furthermore, the terminal b of the capacitor Cs is put to the voltage Vrf. The capacitor Cs is thus discharged into the capacitor formed by the electrodes EH1, EH2, EV1, EV2. The next step 6 is a dead-time step, identical to step 2. In the next step 7, the transistor M3 of the stage connected to the port P3 is switched on to put the terminal b of the capacitor Cs to the ground, so as to enable the voltage at the terminal a of the capacitor Cs to be read by the comparator CP1.

The execution of steps 2 to 7 is then repeated a certain number of cycles until the signal at the input of the comparator CP1, corresponding to the voltage at the terminals a and b of the capacitor Cs, reaches a certain low threshold voltage value. The number of cycles of executing steps 2 to 7 varies according to the capacitance between the electrodes EH1, EH2, EV1, EV2, and thus makes it possible to determine whether or not an object such as a user's finger or hand is in the detection field FLD of the proximity detection device. The dead-time steps 2, 4, 6 make sure that the switching actions of the switches I1 and of the transistors M2, M3 are completed before controlling other switching actions. The duration of these steps may be adapted to the switching characteristics (particularly switching time) of the transistors and of the switches, and to the characteristics of the control signals SA1-SG3. When the voltage at the terminals of the capacitor Cs has reached the threshold voltage, the sequence of steps 1 to 7 is executed again to perform a new detection while the detection device is active. The processor PRC may thus determine the possible presence of an object near the electrodes, in the detection field FLD, if the number of cycles CY of executing steps 2 to 7 is lower than a detection threshold value.

In another embodiment, the execution of steps 3 to 6 is repeated a certain fixed number of cycles. After executing this number of cycles, the voltage of the port P4 is measured in step 7. In this case, the output 104 connected to the terminal a of the capacitor Cs is connected to a measuring circuit such as an analog-digital converter. The presence and the position of an object in the detection field FLD are then determined according to the measurement of the voltage of the capacitor Cs supplied by the measuring circuit.

According to Table 3, it can be noted that the status of some of the transistors M2 and M3 never changes during the execution of the sequence of steps 1 to 7. Thus, the transistors M2, except for the one connected to the port P4, always remain off. The transistors M3 connected to the ports P0 to P2 and P4 are always off too. The circuit IOC2 may therefore be simplified by removing these components. Furthermore, combinations of commands for controlling the switches and transistors M2, M3 other than those indicated in Table 3 may enable the same results to be obtained as regards the connections of the electrodes and of the capacitor Cs between themselves, or to the ground or to the voltage sources at Vh and Vrf.

Unlike the control mode described with reference to FIG. 5 and Table 2, the control mode described with reference to FIG. 6 and Table 3 makes it possible to avoid the capacitor Cs being charged negatively by the electrodes EH1, EH2 in step 3, and thus avoids having to measure negative voltages to locate an object on the touch pad. Indeed, such voltages cannot be measured with standard microcontrollers comprising inputs of analog-digital converters.

The voltage Vh may be equal to the supply voltage of the circuit IOC1, IOC2. In another embodiment, the voltage Vh may be greater than the supply voltage of the circuit, so as to increase the detection distance of the proximity detection device. Thus, the voltage Vh may be set to several tens of volts (for example 30 V), for a supply voltage of a few volts (for example 5 V). The voltage Vh can be generated by a buffer circuit 8 from the supply voltage of the circuit.

Figure 7A:
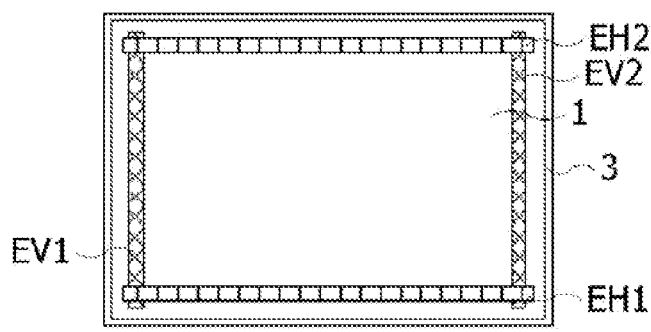
FIGS. 7A to 7D represent various configurations of electrodes of the proximity detection device.
Figure 7B:
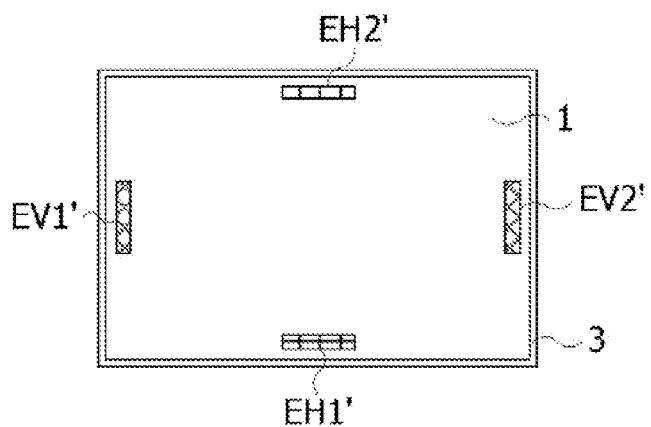
Figure 7C:
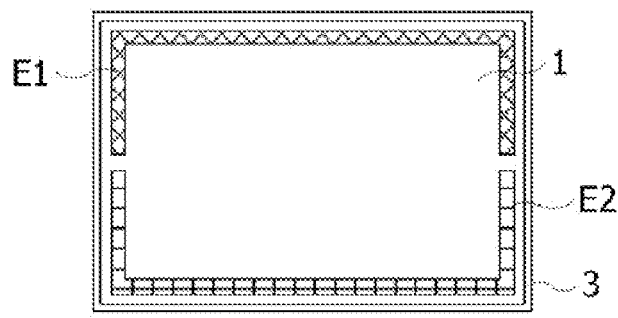
Figure 7D:
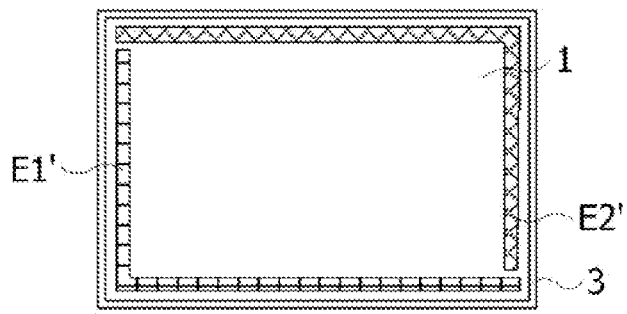

Other configurations of electrodes suited to a proximity detection may easily be imagined. It is merely important that the electrodes be disposed around the central area 1. Thus, FIGS. 7A to 7D represent other configurations of electrodes that may be implemented with the circuits in FIGS. 5 and 6. In FIG. 7A, the electrodes EH1, EH2, EV1, EV2 each have the shape of a band extending along an edge of the central area 1 and overlap at the corners of the latter. In FIG. 7B, the electrodes EH1', EH2', EV1', EV2' each have a rectangular shape covering only a limited part of an edge of the central area 1. In this example, the electrodes EH1', EH2', EV1', EV2' may have other shapes such as circular or elliptic for example. In FIG. 7C, only two electrodes E1, E2 surround the central area. Each of the electrodes E1, E2 has the shape of a U disposed so as to cover an entire edge of the central area 1 as well as a part of the two adjacent edges of the latter. In this case, one of the electrodes E1, E2 is connected to one of the ports P1, P2 of the circuits IOC1, IOC2 in FIGS. 5 and 6 and the other one of the electrodes E1, E2 is connected to one of the ports P3, P4 of the circuit IOC1 or to one of the ports P5, P6 of the circuit IOC2. In FIG. 7D, only two electrodes E1', E2' surround the central area. Each of the electrodes E1', E2' has the shape of an L disposed so as to cover two entire edges of the central area 1. The electrodes E1', E2' may be connected to the circuit IOC1 or IOC2 in the same way as the electrodes E1, E2.

Figure 8:
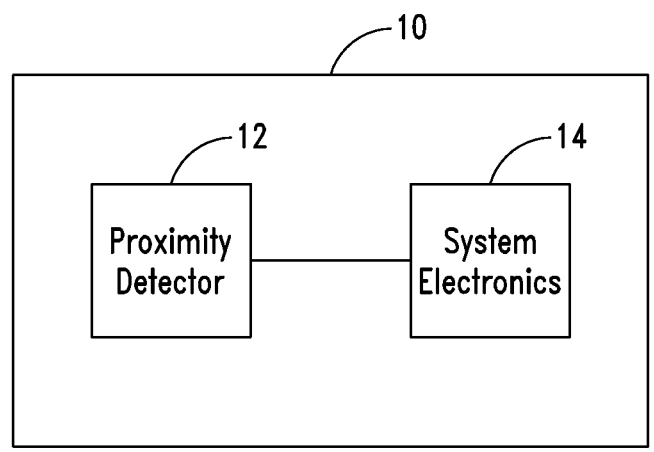
FIG. 8 is a block diagram of a system that includes a proximity detection device, according to one embodiment.

FIG. 8 is a block diagram of a system 10 that includes a proximity detector 12 according to the present disclosure, such as either of the proximity detection devices shown in FIGS. 2-7D. The system 10 may be any electronic device that could benefit from including the proximity detector 12, such as a mobile phone, tablet, or other computing device. The system 10 also includes system electronics 14, coupled to the proximity detector 12, for implementing other functions of the system, such as telecommunications, etc.

It will be understood by those skilled in the art that various alternative embodiments and various applications of the present disclosure are possible. In particular, the present disclosure is not limited to the implementation of the control circuits of the electrodes described with reference to FIGS. 2 and 3. Other known methods for measuring the capacitance of the electrodes EH1, EH2, EV1, EV2 may be implemented, such as those mentioned above. Thus, the capacitance of the electrodes can be measured by implementing methods based on the measurement of a capacitor charge or discharge time into a resistor, methods based on the use of a relaxation oscillator, and other methods based on the charge transfer principle.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method, comprising:
  detecting an object near an electronic system that includes an electrically conductive medium forming a shield, an electrically insulating medium on the electrically conductive medium, and electrodes around a central area and on the electrically insulating medium, the detecting including:

determining measurements representative of a capacitance on the electrodes, the determining for each measurement representative of capacitance including:
executing a number of charge and transfer cycles of charging the electrodes and of transferring the charge between the electrodes and a sampling capacitor, and
monitoring the number of charge and transfer cycles and a voltage across terminals of the sampling capacitor;
comparing the measurements representative of capacitance with a detection threshold; and
deducing whether an object is near the central area in a detection field based on the comparing,
wherein the determining includes simultaneously activating all the electrodes.

2. The method according to claim 1, further comprising defining the detection threshold so as to detect an object at a distance of at least several centimeters along an axis perpendicular to the central area and passing through a point of the central area, located at an equal distance from opposite pairs of electrodes of the electrodes.

3. The method according to claim 1, comprising generating a voltage greater than a supply voltage of the electronic system, wherein the determining includes using the voltage generated to determine the measurements representative of the capacitance on the electrodes.

4. The method according to claim 1, wherein the determining includes, for each measurement representative of the capacitance of the electrodes:
applying a first voltage to a first terminal of a sampling capacitor and a second voltage to a second terminal of the sampling capacitor,
applying a third voltage to a first group of the electrodes, and the second voltage to a second group of the electrodes, not comprising the electrodes of the first group, wherein the second voltage is between the first and third voltages and the third voltage is greater than or equal to a ground voltage;
transferring electric charges between the electrodes and the sampling capacitor by linking the electrodes of the first group to the first terminal of the sampling capacitor and applying the second voltage to the electrodes of the second group and to the second terminal of the sampling capacitor;
executing a fixed number of cycles of the applying the third voltage and transferring the electric charges; and
determining the measurement representative of the capacitance of the electrodes as a function of a voltage of the sampling capacitor after executing the fixed number of cycles.

5. The method according to claim 1, wherein the determining includes, for each measurement representative of the capacitance of the electrodes:
applying a first voltage to a first terminal of a sampling capacitor and a second voltage to a second terminal of the sampling capacitor,
applying a third voltage to a first group of the electrodes, and the second voltage to a second group of the electrodes, not comprising the electrodes of the first group, wherein the second voltage is between the first and third voltages and the third voltage is greater than or equal to a ground voltage;
transferring electric charges between the electrodes and the sampling capacitor by linking the electrodes of the first group to the first terminal of the sampling capacitor and applying the second voltage to the electrodes of the second group and to the second terminal of the sampling capacitor;
executing a plural number of cycles of the applying the third voltage and transferring the electric charges; and
determining the measurement representative of the capacitance of the electrodes as a function of the number of cycles executed until a voltage of the sampling capacitor reaches a threshold voltage.

6. A method, comprising:
detecting an object near an electronic system that includes an electrically conductive medium forming a shield, an electrically insulating medium on the electrically conductive medium, and electrodes around a central area and on the electrically insulating medium, the detecting including:
determining measurements representative of a capacitance on the electrodes, the determining for each measurement representative of capacitance including:
executing a fixed number of charge and transfer cycles of charging the electrodes and of transferring the charge between the electrodes and a sampling capacitor, and
determining the measurement representative of the capacitance on the electrodes according to the voltage at terminals of the sampling capacitor after the fixed number of the charge and transfer cycles;
comparing the measurements representative of capacitance with a detection threshold; and
deducing whether an object is near the central area in a detection field based on the comparing, the determining includes simultaneously activating all the electrodes.

7. The method of claim 6, further comprising:
precharging the sampling capacitor with a source voltage before executing a fixed number of charge and transfer cycles.

8. The method of claim 7, further comprising:
generating the source voltage from a supply voltage with a buffer circuit, the source voltage greater than the supply voltage.

9. A proximity detection device, comprising:
a central structure;
an electrically insulating medium having a first surface facing a detection field, a second surface opposite the first surface, and an outer side surface extending between the first surface and the second surface and being transverse to the first and second surfaces, the electrically insulating medium laterally surrounding the central structure;
electrode positioned laterally around and spaced from the central structure, the electrodes being positioned in the electrically insulating medium;
an electrically conductive shield laterally surrounding the central structure and the insulating medium, the electrically conductive shield having a first portion and a second portion that is transverse to the first portion, the second portion being on the second surface of the electrically insulating medium and the first portion being on the outer side surface of the electrically insulating medium, the first portion of the shield being separated from the central structure by the insulating medium;
a control circuit configured to control the electrodes, determine measurements representative of a capacitance on the electrodes, compare the measurements with a detection threshold, and deduce whether an object is near the central area in a detection field based on comparing the measurements with the detection threshold.

10. The device according to claim 9, wherein the control circuit is configured to determine the capacitance measurements by simultaneously activating all the electrodes.

11. The device according to claim 9, wherein the detection threshold is such that the control device is configured to detect an object at a distance of at least several centimeters along an axis perpendicular to the central structure and passing through a point of the central structure, located at an equal distance from opposite pairs of electrodes of the electrodes.

12. The device according to claim 9, wherein the first portion of the electrically conductive shield extends past the first surface of the electrically insulating medium towards the detection field.

13. The device according to claim 9, further comprising:
a second electrically insulating medium between the electrodes and the electrically conductive shield.

14. The device according to claim 9, comprising a buffer circuit configured to generate, from a supply voltage, a boosted voltage greater than the supply voltage, the control circuit being configured to use the boosted voltage to determine at least one of the measurements representative of the capacitance on the electrodes.

15. The device according to claim 9, wherein the shield is connected to a ground voltage.

16. The device according to claim 9, further comprising a sampling capacitor, wherein the control circuit is configured to:
execute several cycles of charging the electrodes and of transferring charge between the electrodes and the sampling capacitor, and
determine one of the measurements representative of the capacitance on the electrodes according to how many of the cycles are used to obtain a voltage at terminals of the sampling capacitor that reaches a threshold voltage.

17. The device according to claim 9, further comprising a sampling capacitor, wherein the control circuit is configured to:
apply a first voltage to a first terminal of the sampling capacitor and a second voltage to a second terminal of the sampling capacitor,
apply a third voltage to a first group of the electrodes, and the second voltage to a second group of the electrodes, not comprising the electrodes of the first group, wherein the second voltage is between the first and third voltages and the third voltage is greater than or equal to a ground voltage;
link the electrodes of the first group to the first terminal of the sampling capacitor and applying the second voltage to the electrodes of the second group and to the second terminal of the sampling capacitor, to transfer electric charges between the electrodes and the sampling capacitor,
execute a fixed number cycles of the applying the third voltage and linking the electrodes; and
determine one of the measurements representative of the capacitance on the electrodes as a function of a voltage of the sampling capacitor after executing the fixed number of cycles.

18. The device according to claim 9, wherein the electrodes include first and second electrodes extending longitudinally along opposite first and second sides of the central structure and third and fourth electrodes extending longitudinally along opposite third and fourth sides of the central structure, the first and second sides of the central structure being transverse with respect to the third and fourth sides of the central structure.

19. An electronic system comprising:
system electronics; and
a proximity detection device coupled to the system electronics and including:
a central structure;
an electrically insulating medium having a first surface facing a detection field, a second surface opposite the first surface, and an outer side surface extending between the first surface and the second surface and being transverse to the first and second surfaces, the electrically insulating medium laterally surrounding the central structure;
electrodes positioned laterally around and spaced from the central structure, the electrodes being positioned in the electrically insulating medium;
an electrically conductive shield laterally surrounding the central structure and the insulating medium, the electrically conductive shield having a first portion and a second portion that is transverse to the first portion, the second portion being on the second surface of the electrically insulating medium and the first portion being on the outer side surface of the electrically insulating medium, the first portion of the shield being separated from the central structure by the insulating medium;
a control circuit configured to control the electrodes, determine measurements representative of a capacitance on the electrodes, compare the measurements with a detection threshold, and deduce whether an object is near the central area in a detection field based on comparing the measurements with the detection threshold.

20. The system according to claim 19, wherein the control circuit is configured to determine the capacitance measurements by simultaneously activating all the electrodes.

21. The system according to claim 19, wherein the first portion of the electrically conductive shield extends past the first surface of the electrically insulating medium towards the detection field.

22. The system according to claim 19, further comprising:
a second electrically insulating medium between the electrodes and the electrically conductive shield.

23. The system according to claim 19, wherein the detection device is configured to generate, from a supply voltage, a boosted voltage greater than the supply voltage, and the control circuit is configured to use the boosted voltage to determine at least one of the measurements representative of the capacitance on the electrodes.

24. The system according to claim 19, wherein the detection device includes a sampling capacitor, wherein the control circuit is configured to:
execute a fixed number of cycles of charging the electrodes and of transferring charge between the electrodes and the sampling capacitor, and
determine one of the measurements representative of the capacitance on the electrodes according to a voltage at terminals of the sampling capacitor after the fixed number of cycles.

25. The system according to claim 19, wherein the detection device includes a sampling capacitor, wherein the control circuit is configured to:
apply a first voltage to a first terminal of a sampling capacitor and a second voltage to the second terminal of the sampling capacitor;

apply a third voltage to a first group of the electrodes, and the second voltage to a second group of the electrodes, not comprising the electrodes of the first group, wherein the second voltage is between the first and third voltages and the third voltage is greater than or equal to a ground voltage;

link the electrodes of the first group to the first terminal of the sampling capacitor and applying the second voltage to the electrodes of the second group and to the second terminal of the sampling capacitor, to transfer electric charges between the electrodes and the sampling capacitor, execute several cycles of the applying the third voltage and linking the electrodes; and determine one of the measurements representative of the capacitance on the electrodes as a function of how many of the cycles are used to obtain a voltage at a terminal of the sampling capacitor reaches a threshold voltage.

26. The system according to claim 19, wherein the electrodes include first and second electrodes extending longitudinally along opposite first and second sides of the central structure and third and fourth electrodes extending longitudinally along opposite third and fourth sides of the central structure, the first and second sides of the central structure being transverse with respect to the third and fourth sides of the central structure.

27. A proximity detection device comprising:
a central structure;
a plurality of electrodes laterally surrounding the central structure;
an electrically conductive shield that includes a conductive frame completely laterally surrounding the plurality of electrodes and the central structure;
an insulating medium that insulates the electrodes from the shield, the insulating medium including a first surface facing a detection field, a second surface opposite to the first surface, and an outer side surface between the first surface and the second surface and being transverse to the first and second surfaces, the shield being on the second surface and on the outer side surface of the insulating medium; and
a controller configured to make measurements representative of a capacitance on the electrodes and determine whether an object is within the detection field based on the measurements.

28. The device according to claim 27, wherein the electrodes include first and second electrodes extending longitudinally along opposite first and second sides of the central structure and third and fourth electrodes extending longitudinally along opposite third and fourth sides of the central structure, the first and second sides of the central structure being transverse with respect to the third and fourth sides of the central structure.

29. The device according to claim 27, wherein the electrodes are completely enclosed within the insulating medium.

30. The device according to claim 27, wherein the frame of the shield includes a lower portion on which the insulating medium and electrodes are positioned and an outer portion that completely laterally surrounds the electrodes.

* * * * *